United States Patent
Roohparvar

Patent Number: 5,955,913
Date of Patent: *Sep. 21, 1999

[54] INTEGRATED CIRCUIT OPERABLE IN A MODE HAVING EXTREMELY LOW POWER CONSUMPTION

[75] Inventor: Fariborz F. Roohparvar, Cupertino, Calif.

[73] Assignee: Micron Technology, Inc., Boise, Id.

[*] Notice: This patent is subject to a terminal disclaimer.

[21] Appl. No.: 09/104,263

[22] Filed: Jun. 24, 1998

Related U.S. Application Data

[63] Continuation of application No. 08/814,218, Mar. 11, 1997, Pat. No. 5,801,585, which is a continuation of application No. 08/498,530, Jul. 5, 1995, Pat. No. 5,670,906.

[51] Int. Cl.$^6$ ........................................... H03K 3/01
[52] U.S. Cl. ...................... 327/534; 327/544; 365/185.27
[58] Field of Search ..................... 327/427, 434, 327/534, 535, 530, 544; 365/185.24, 185.27

[56] References Cited

U.S. PATENT DOCUMENTS

| | | | |
|---|---|---|---|
| 5,416,738 | 5/1995 | Shrivastava | 365/185 |
| 5,430,403 | 7/1995 | Moyer et al. | 327/365 |
| 5,467,306 | 11/1995 | Kaya et al. | 365/185.2 |
| 5,521,546 | 5/1996 | Kim | 327/536 |
| 5,670,906 | 9/1997 | Roohparvar | 327/544 |
| 5,801,585 | 9/1998 | Roohparvar | 327/544 |

Primary Examiner—Timothy P. Callahan
Assistant Examiner—Jung Ho Kim
Attorney, Agent, or Firm—Schwegman, Lundberg, Woessner & Kluth P.A.

[57] ABSTRACT

An integrated circuit selectively operable in either a first mode (consuming low power) or a second mode (consuming relatively high power). The circuit includes MOS transistors and a supply voltage circuit for at least one of the transistors. In both modes, the supply voltage circuit holds the body of each transistor at a fixed voltage (e.g., a voltage $V_{CC}$ in a range from 5 to 5.5 volts, where each transistor is a PMOS device). In the second mode the supply voltage circuit supplies this fixed voltage to the source of each transistor, but in the first mode it supplies a voltage equal to or slightly offset from the fixed voltage to the source of each transistor. In some embodiments, the supply voltage circuit (in the first mode, after an initial transient state) supplies a first voltage to a well shared by a plurality of PMOS transistors, and a second voltage to the source of each PMOS device. Alternatively, the supply voltage circuit (in the first mode, after an initial transient state) supplies a first voltage to the body of each of a plurality of NMOS transistors, and a second voltage to the source of each NMOS device. The second voltage is preferably offset from the first voltage by a voltage drop chosen to achieve a desired decrease in transistor leakage current in the first mode and a desired power up time for a transition from the first mode to the second mode. In preferred embodiments, the integrated circuit is a memory chip including a flash memory array, the voltage drop is in the range from 1.4 volts to 2 volts, and the voltage drop is implemented with one diode-connected MOS transistor or two diode-connected MOS transistors connected in series.

37 Claims, 5 Drawing Sheets

INTEGRATED CIRCUIT OPERABLE IN A MODE HAVING EXTREMELY LOW POWER CONSUMPTION

This application is a continuation of U.S. patent application Ser. No. 08/814,218, filed Mar. 11, 1997, U.S. Pat. No. 5,801,585, which in turn is a continuation of Ser. No. 08/498,530 filed Jul. 5, 1995, U.S. Pat. No. 5,670,906.

BACKGROUND OF THE INVENTION

1. Field of the Invention

The present invention relates generally to an integrated circuit operable in a selected one of a first ("deep power down") mode in which it consumes extremely low power and a second ("active") mode in which it consumes relatively high power. In the deep power down mode of preferred embodiments including CMOS circuitry, a first voltage is supplied to the body of one or more MOS transistors all having a common polarity (N-channel or P-channel), a second voltage is supplied to the source of each MOS transistor, and the voltage difference between the first voltage and the second voltage is selected to achieve a desired decrease in leakage current in each transistor during the deep power down mode.

2. Description of Related Art

For convenience, the following notation is used in the description of the drawings (FIGS. 1–8). The symbol –N (where "N" is any signal name) is used in the specification to denote a signal identified by the corresponding symbol $\overline{N}$ in the drawings.

The description of FIGS. 1–8 assumes that each signal –N represents a logical "1" when its value (e.g., voltage level) is low (below a threshold), and represents a logical "0" when its value is high (above the threshold). Of course, it is within the scope of the invention to employ circuitry implementing the logical functions described with signals having the opposite polarities.

Throughout the specification, including in the claims, the term "connected" is used (in the context of an electronic component being "connected" to another electronic component) in a broad sense to denote that the components are electrically or electromagnetically coupled with sufficient strength under the circumstances. It is not used in a narrow sense requiring that an electrically conducting element is physically connected between the two components.

Many conventional integrated circuits (such as memory circuits) operate in one of: a "deep power down" mode in which all but essential component circuits are shut off to save power (typically, a chip draws no more than a few microamps in a deep power down mode); a "standby" mode in which a somewhat higher current consumption (e.g., as much as 100–500 microamps) can be tolerated; and an "active" (or "enabled") mode in which all component circuits are enabled to perform their intended functions (the chip typically draws tens or hundreds of milliamps of current in the active mode). In this specification, including in the claims, the term "active" mode is used in a broad sense to refer either to the second or third (but not the first) of these three modes. Typically, such circuits have a pad to which an external device asserts a "deep power down" command signal. Such a command signal is a digital signal whose level indicates either that the integrated circuit should operate in a deep power down mode, or that the integrated circuit should operate in an active mode.

Figure 1:
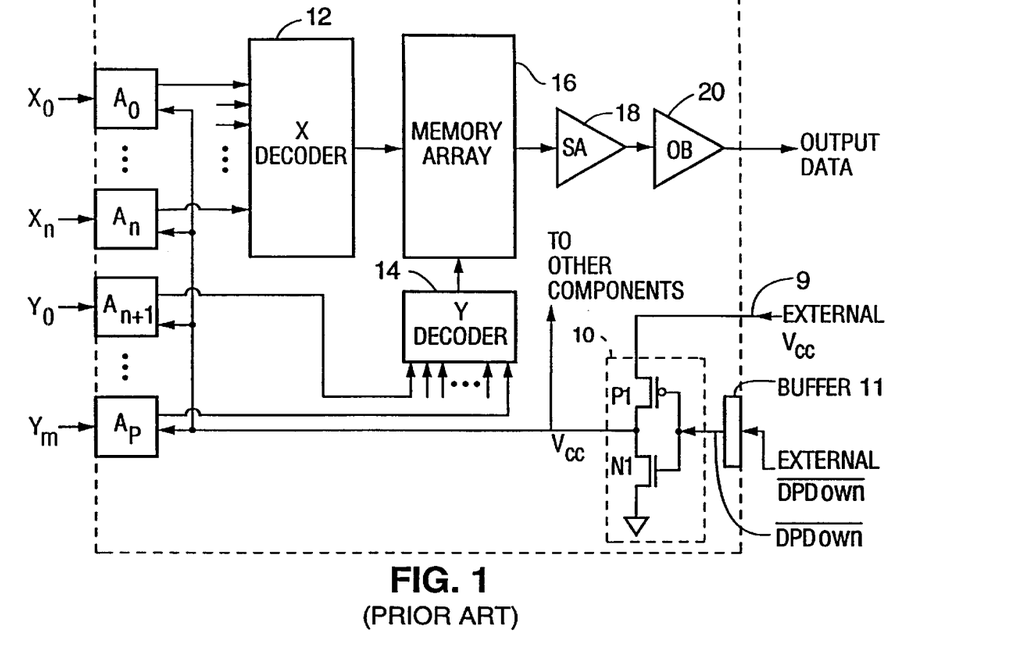
FIG. 1 is block diagram of a conventional integrated circuit (a memory circuit), including a supply voltage circuit for generating an internal voltage ($V_{CC}$) in response to an external voltage (External $V_{CC}$) and a control signal (-DPDown).

For example, FIG. 1 is a simplified block diagram of a conventional CMOS memory circuit (an integrated circuit) which includes the following components: supply voltage circuit 10, address buffers A0 through Ap, address decoder circuits 12 and 14, memory array 16, sense amplifier 18, and output buffer 20. Each of the storage locations of memory array circuit 16 is indexed by a row index (an "X" index output from decoder circuit 12) and a column index (a "Y" index output from decoder circuit 14).

Each of address buffers A0 through Ap is connected to a different address bit pad, and each receives (from an external device) a different one of address bit signals X0 through Xn and Y0 through Ym.

Supply voltage circuit 10 provides an internal voltage ($V_{CC}$) to various ones of the components of the FIG. 1 chip (including each of the address buffers) in response to an external voltage (External $V_{CC}$) received at pad 9 and a control signal (–DPDown). An external control signal "External –DPDown" is received from an external device at buffer circuit 11. Buffer circuit 11 buffers this signal to generate control signal –DPDown and asserts control signal –DPDown to circuit 10.

Supply voltage circuit 10 is a CMOS inverter comprising P-channel MOS transistor P1 (which is a large P-channel device that can support the current requirement of the entire FIG. 1 chip) and N-channel MOS transistor N1. The source of P1 receives externally supplied voltage "External $V_{CC}$", the drain of P1 is connected to the drain of N1, and the source of N1 is connected to ground. The gate of each of transistors P1 and N1 is connected to the output of buffer circuit 11 so as to receive control signal –DPDown.

When control signal –DPDown is high, the internal voltage ($V_{CC}$) output from circuit 10 to various components of the FIG. 1 chip has a relatively high value (for example, 5 or 5.5 volts). This internal voltage enables each of the components to which it is supplied to operate in an active mode (in which it consumes relatively high power) unless such component is wholly or partially disabled by some other external control signal (not shown). When the components of the FIG. 1 chip are all enabled, the FIG. 1 chip operates in an active mode (for example to execute a read or write operation).

In contrast, when –DPDown is low, the FIG. 1 chip operates in an inactive mode (known as the "deep power down" mode). In the deep power down mode, the internal voltage ($V_{CC}$) line is grounded (i.e., the internal voltage output from circuit 10 to components of the FIG. 1 chip has a relatively low value). In response to this (grounded) internal voltage, each of the components enters an inactive mode ("deep power down" mode) in which it consumes relatively low power.

In the active mode (in response to a high value of –DPDown), the FIG. 1 chip can execute a write operation as follows. Each of address buffers A0 through An asserts one of bits X0-Xn to X address decoder circuit 12 and each of address buffers An+1 through Ap asserts one of bits Y0-Ym to Y address decoder circuit 14. In response to these address bits, X address decoder 12 asserts a row address to memory array 16 and Y address decoder 14 assert a column address to memory array 16. In response to a write command supplied from control circuitry (not shown in FIG. 1), a quantity of data is written to the storage location of array 16 determined by the row and column address.

Also in its active mode, the FIG. 1 chip responds as follows to a "read" command. Each of the address buffers A0 through An asserts one of the input address bits X0-Xn to X address decoder circuit 12 and each of address buffers An+1 through Ap asserts one of the input address bits Y0-Ym to Y address decoder circuit 14. In response to these address bits, the X and Y address decoders assert a row address and a column address to memory array 16, array 16 outputs to sense amplifier 18 a data signal indicative of a data value stored in the storage location determined by the row and column address, amplifier 18 asserts a corresponding amplified data signal to output buffer 20, and output buffer 20 asserts a corresponding "Output Data" signal at an external pin of the FIG. 1 circuit.

Figure 2:
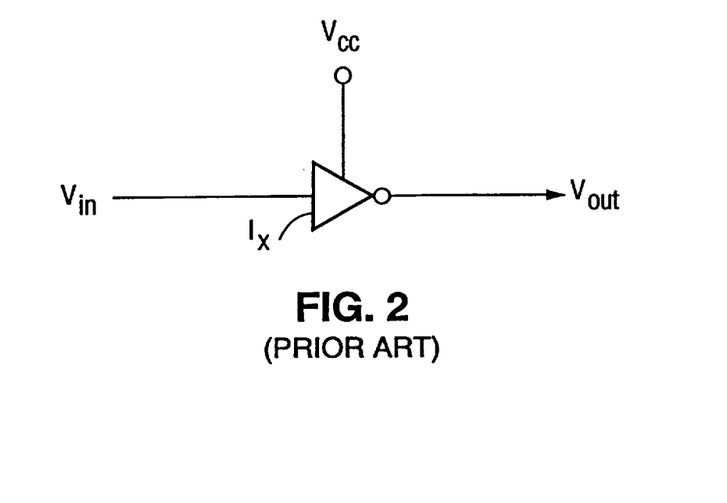
FIG. 2 is a diagram of an inverter circuit employed in a typical implementation of each of address buffers A0 through Ap of the FIG. 1 circuit.

FIG. 2 is an inverter circuit Ix of a type included in a typical implementation of each of address buffers A0 through Ap of FIG. 1. The inverter of FIG. 2 circuit receives a TTL level input voltage Vin (indicative of an address bit), and outputs an inverted (and level-translated) voltage Vout in response.

Figure 3:
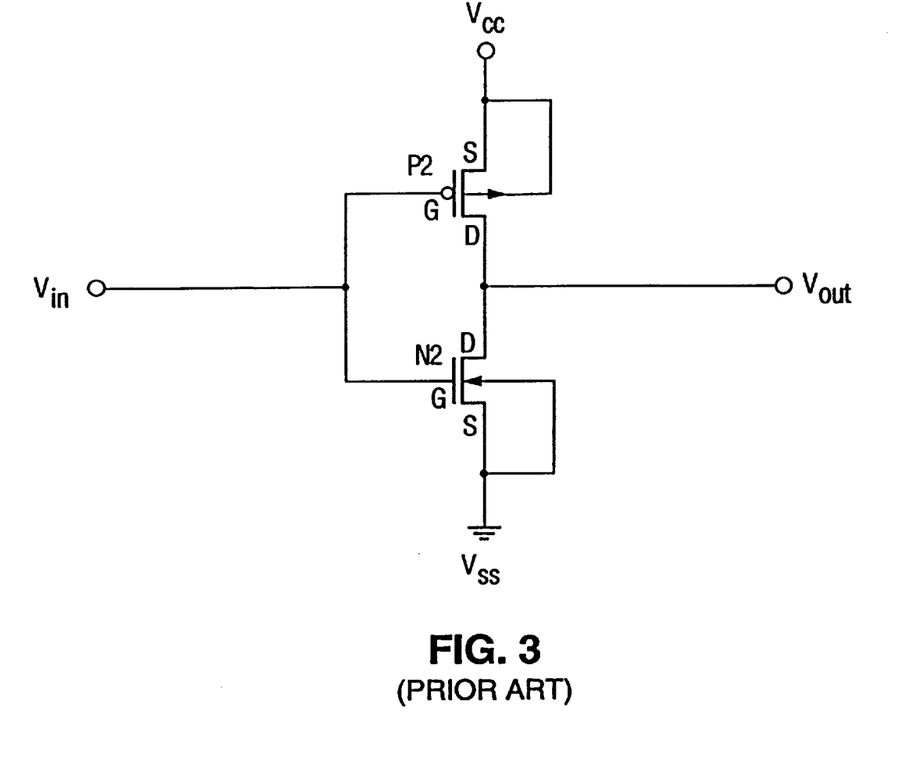
FIG. 3 is a schematic diagram of a typical implementation of the inverter circuit of FIG. 2.

FIG. 3 is a typical implementation of inverter circuit Ix of FIG. 2. The circuit of FIG. 3 is a CMOS inverter comprising P-channel MOS transistor P2 and N-channel MOS transistor N2. The source of P2 is connected to internal supply voltage $V_{CC}$ (supplied from supply voltage circuit 10), the drain of P2 is connected to the drain of N2, and the source of N2 is connected to ground. The gate of each of transistors P2 and N2 receives input voltage Vin. When voltage $V_{CC}$ is high (e.g., 5 or 5.5 volts), the FIG. 3 circuit responds to $V_{in}$ as follows. When $V_{in}$ is low, transistor P2 is "on" and transistor N2 is "off," so that the voltage level ($V_{out}$) of FIG. 3 is pulled "high" by $V_{CC}$. When $V_{in}$ is high, transistor P2 is "off" and transistor N2 is "on," so that the output node is pulled "low."

Figure 4:
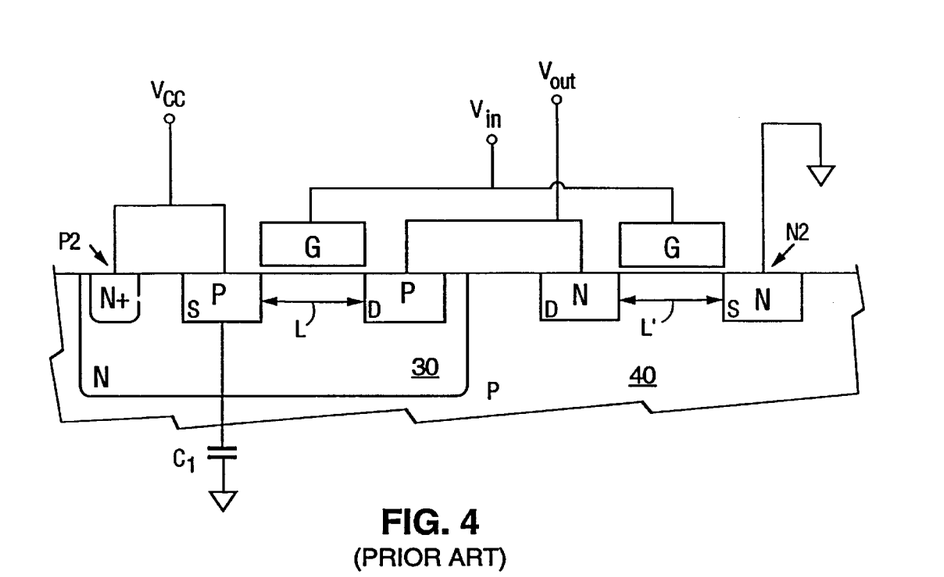
FIG. 4 is a typical CMOS implementation of the inverter circuit of FIG. 3.

FIG. 4 is a typical CMOS implementation of the inverter circuit of FIG. 3. The source and drain of P-channel transistor P2 are formed in well 30 (composed of N-type semiconducting material). Well 30 is formed in substrate 40 (composed of P-type semiconducting material), as are the source and drain of N-channel transistor N2. The large capacitance on the source of P2 is represented by capacitor C1 (shown connected between the source of P2 and ground). In typical implementations of the FIG. 1 memory chip, it is desirable that lengths, L and L' respectively, of the channels of transistors P2 and N2 are very short for maximum speed of operation.

The chip will draw a total of on the order of tens of milliamps to hundreds of milliamps when in the active mode. It is often desired (e.g., for laptop computer applications of FIG. 1 in which memory array 16 is an array of flash memory cells with four megabit density) that FIG. 1 consume no more than a few microamps of current in a deep power down mode (when the control signal –DPDown is low).

However, there is a significant problem inherent in operation of the conventional circuit described with reference to FIGS. 1–4 in transitions from the deep power down mode to the active mode.

The problem is that, as a result of supply voltage circuit 10's decoupling of External $V_{CC}$ from the address buffers (and other components), a long time is required to come out of the "deep power down" mode in response to a low-to-high transition of signal –DPDown. One mechanism that contributes to this problem is that the memory elements of array 16 must be able to be read upon transition to the "active" mode. This requires preconditioning of all relevant voltage levels to their proper values. Since all these voltages have been brought down to zero as a result of $V_{CC}$ shutting off, restoring these values requires a significant amount of time.

Another mechanism contributing to the problem is that if the voltage applied to the well of a P-channel transistor (during a "deep power down" to "active" transition) is increased too rapidly, the undesirable effect of latch-up might occur. For example, in typical implementations of FIG. 1, many P-channel transistors share a common well (e.g., well 30 of FIG. 4) formed in a substrate of N-type semiconductor material (e.g., substrate 40 of FIG. 4). To power up each such transistor during a "deep power down" to "active" mode transition, the voltage $V_{CC}$ applied to the well is increased from ground to the appropriate value (e.g., 5.5 volts). However, if the voltage applied to the well increases too rapidly, the resulting charge injection from the substrate to the well can cause latch-up. Thus, the voltage applied to the well must be increased sufficiently slowly to control undesirable charge injection from the substrate (e.g., substrate 40 of FIG. 4) and thereby avoid latch-up. These mechanisms make it difficult (or impossible) to meet the typical specification of a transition time of on the order of 100 nanoseconds for a "deep power down" to "active" mode transition.

Another problem, inherent in conventional memory chips which apply External $V_{CC}$ to their component transistors in all operating modes, is unacceptably high subthreshold leakage current (e.g., leakage between the source and drain of transistor P2 of FIG. 4) and thus unacceptably high power consumption in the transistors to which the External $V_{CC}$ voltage remains coupled during a deep power down mode. Such leakage occurs (unless reduced in accordance with the present invention) due to inherent defects in the transistor manufacturing process, and is especially significant with transistors having very short channel lengths (e.g., implementations of transistors P2 and N2 of FIG. 4 having very short channel lengths L and L'). For example, typical implementations of transistor P2 of FIG. 4 have leakage current in the range from 1 nA to 5 nA in the deep power down mode. Thus, in embodiments of a conventional memory chip which include twenty address buffers (each address buffer including one such FIG. 4 inverter), and an implementation of decoder circuit 12 including 4000 of the FIG. 4 inverters, the address buffers and circuit 12 will themselves draw a total of 4–20 microamps in the deep power down mode. This current is much greater than the typical design specification of 1 microamp for current consumption of a memory chip in the deep power down mode.

The leakage problem described in the previous paragraph could be reduced by employing transistors having longer channel lengths. However, this would undesirably decrease performance by decreasing the current drive capability of the transistors. In order to remedy this situation, it would be necessary to increase the width of the transistors and thus the required size (footprint) of a VLSI implementation.

SUMMARY OF THE INVENTION

The invention is an integrated circuit selectively operable in either a "deep power down" mode (in which it consumes relatively low power) or an active mode (in which it consumes relatively high power). The integrated circuit includes a supply voltage circuit, a first set of one or more MOS transistors having a first polarity (the first set consists of N-channel or P-channel devices), and optionally also a second set of one or more MOS transistors of the opposite polarity. In both operating modes, the supply voltage circuit holds the body of each transistor in the first set at a fixed potential (e.g., a supply voltage $V_{CC}$ in the range from 5 to 5.5 volts, in the case each transistor is a PMOS device). In the active mode, the supply voltage circuit holds the source of each transistor in the first set at a potential equal (or substantially equal) to such fixed potential. In the deep power down mode, the supply voltage circuit decouples the source of each transistor in the first set from the body of each such transistor, in the sense that (in the deep power down mode) the source at least initially floats (from its initial potential) while the body is held at the fixed potential. Preferably (during the deep power down mode), the source is then held at a different potential after floating by a back bias voltage from the initial fixed potential. The back bias voltage is chosen to achieve both a desired decrease in leakage current in each transistor and a desired "power up" time for undergoing a transition from the deep power down mode to the active mode.

In preferred embodiments, the supply voltage circuit (in the deep power mode, after the initial transient state) supplies a first supply voltage $V_{CC}$ to a well shared by a plurality of P-channel transistors, and a second supply voltage $V'_{CC}$ to the source of each of the P-channel transistors. In other preferred embodiments, the supply voltage circuit (in the deep power mode, after the initial transient state) supplies a first supply voltage (e.g., ground voltage) to the body of each of a plurality of N-channel transistors, and a second supply voltage to the source of each of the N-channel transistors. In preferred embodiments, the second supply voltage is offset from the first supply voltage by a nonzero voltage difference. This voltage difference, sometimes referred to herein as a "back bias voltage" or a "voltage drop," is preferably chosen to achieve a desired decrease in leakage current in each transistor in the deep power down mode (while also enabling each transistor to be powered up in a desired time following the deep power down mode).

In preferred embodiments for supplying power to P-channel transistors formed in a well, the source of each P-channel device is held at a voltage below that of the well by a positive back bias voltage (in the deep power down mode, after the initial transient state). In preferred embodiments for supplying power to N-channel transistors, the source of each N-channel device is at a voltage above that of the body by a positive back bias voltage (in the deep power down mode, after the initial transient state). In both the N-channel and P-channel cases, the magnitude of the back bias voltage is preferably chosen to achieve a desired decrease in leakage current in each transistor with a desired "power up" time for undergoing a transition from the deep power down mode to the active mode.

In preferred implementations, the integrated circuit of the invention is a memory circuit (typically, this memory circuit comprises CMOS integrated circuitry). In a class of embodiments in which the inventive circuit is a memory chip (e.g., a memory chip including a flash memory array), its supply voltage circuit operates in response to an external control signal (-DPDown) and an external reference voltage (a voltage $V_{CC}$ in a range from 5 to 5.5 volts above ground), and implements a back bias voltage (in the deep power down mode) in the range from 1 volt to 2 volts.

The back bias voltage of the invention is preferably implemented with one diode-connected MOS transistor or two diode-connected MOS transistors connected in series, but alternatively can be implemented by other means such as an MOS transistor configured as a source follower with a voltage on its gate which determines the magnitude of the back bias voltage level.

DETAILED DESCRIPTION OF THE INVENTION

Figure 6:
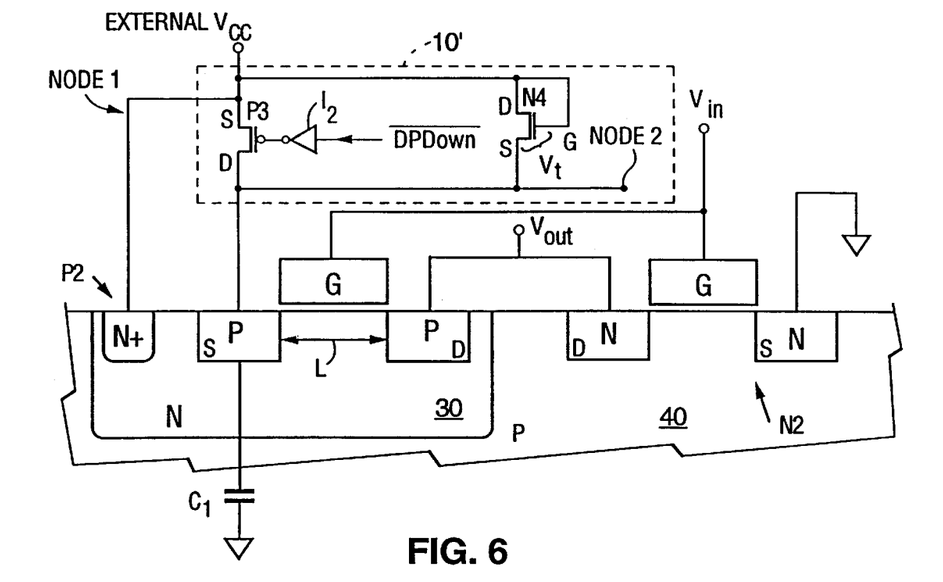
FIG. 6 is a CMOS implementation of an inverter circuit (a component of the FIG. 5 circuit) connected to the supply voltage circuit of FIG. 5.
Figure 8:
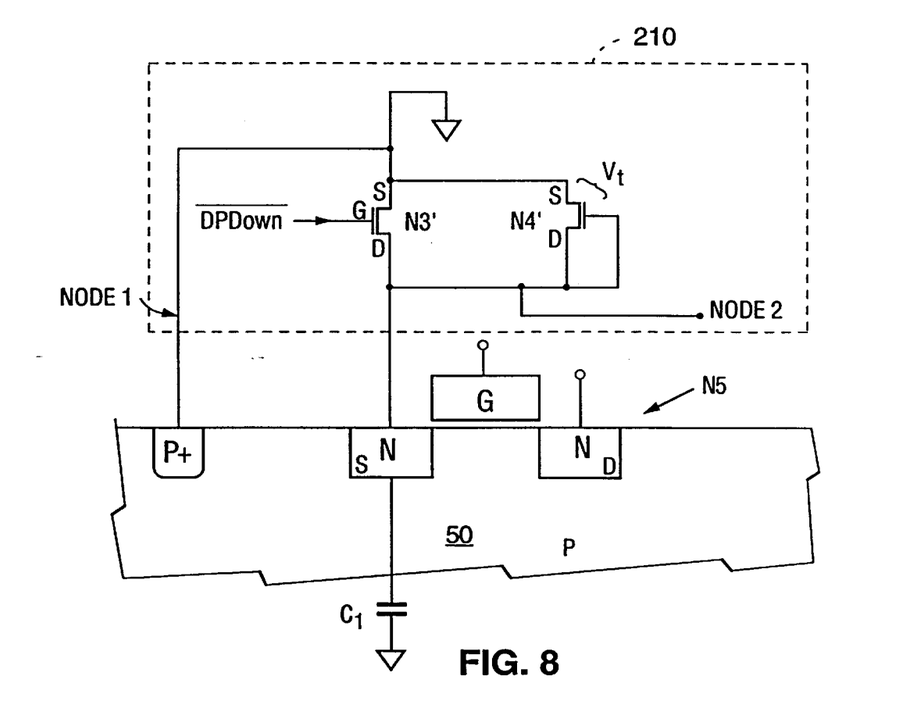
FIG. 8 is an N-channel transistor (a component of a variation on the FIG. 5 circuit) connected to an alternative embodiment of the supply voltage circuit of the invention.

Throughout the specification (including in the claims), the term "body" of a transistor is employed to denote either the substrate of a transistor that is not formed in a well (substrate 50 of NMOS transistor N5 of FIG. 8 is the "body" of transistor N5), or the well of a transistor that is formed in a well (well 30 of PMOS transistor P2 of FIG. 6 is the "body" of transistor P2).

Figure 5:
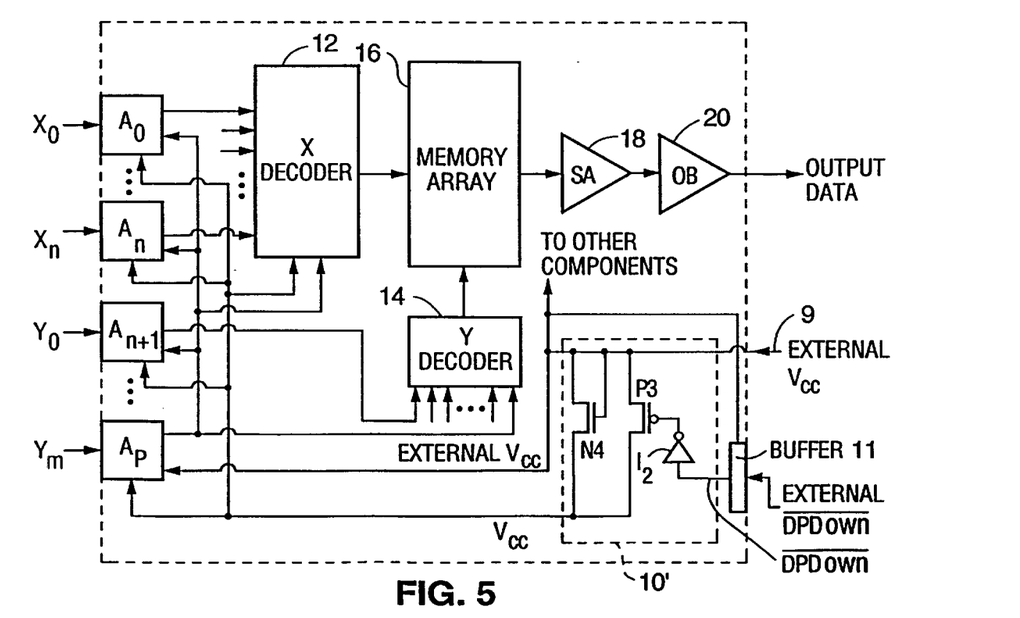
FIG. 5 is a block diagram of an integrated circuit (a memory chip) embodying the present invention. The FIG. 5 circuit includes an improved supply voltage circuit which generates an internal voltage ($V_{CC}$) in response to an external reference voltage (External $V_{CC}$) and a control signal (-DPDown), supplies the internal voltage to the source (but not the body) of at least one P-channel transistor of a component thereof, and supplies the external reference voltage to the body of each such P-channel transistor.
Figure 5A:
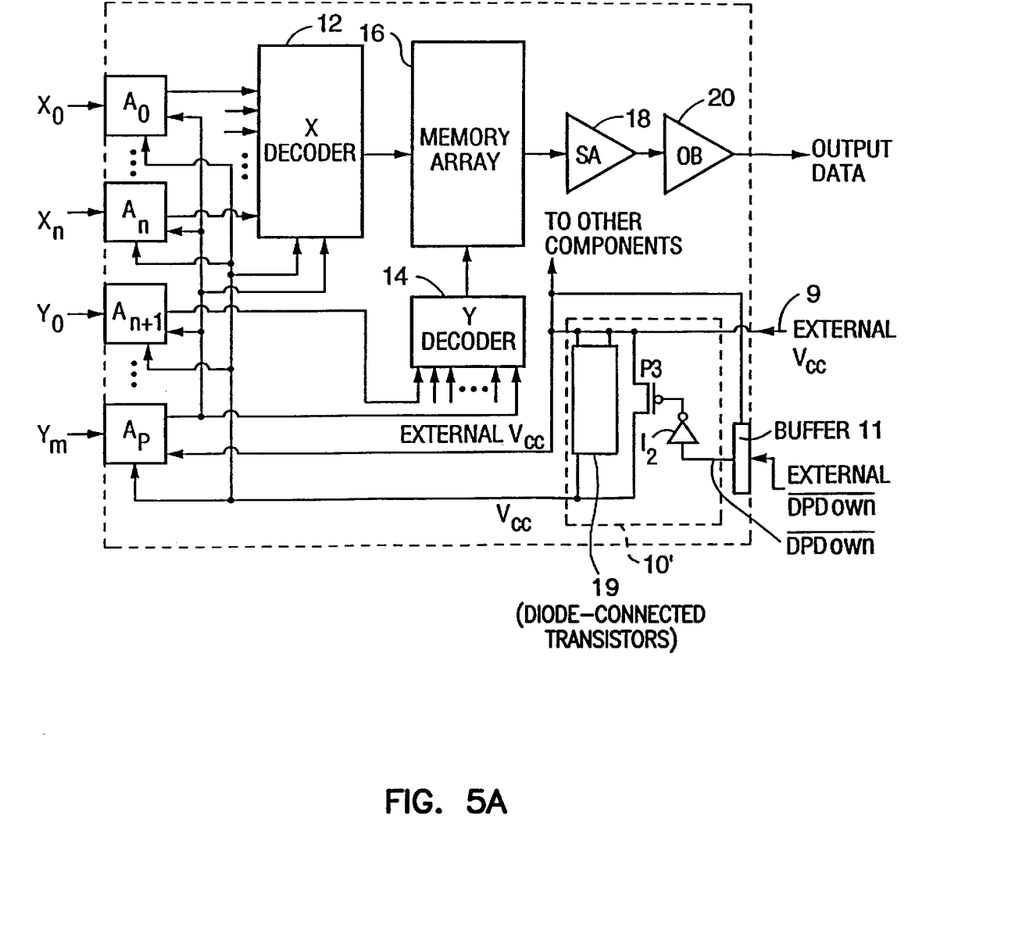
FIG. 5A is a block diagram of an integrated circuit which is a variation on that of FIG. 5.

FIG. 5 is a block diagram of a memory circuit which is implemented as an integrated circuit and which embodies the invention. Except as explained below, the FIG. 5 circuit is identical to the FIG. 1 circuit, corresponding components of the circuits of FIG. 5 and 1 (and their input and output signals) are identically labeled (e.g., memory array circuit 16 of both FIGS. 1 and 5 is preferably an array of flash memory cells), and the foregoing description of these components and signals will not be repeated below.

The FIG. 5 circuit differs from the conventional FIG. 1 circuit by including a supply voltage circuit 10' which has two output lines ($V_{CC}$ and External $V_{CC}$), rather than conventional supply voltage circuit 10 of FIG. 1 (which has just one output line ($V_{CC}$). Circuit 10' includes PMOS transistor P3 and diode-connected NMOS transistor N4 (whose drain and gate are connected to the source of P3) connected as shown. The source of transistor P3 is connected to pad 9 and thus receives the voltage "External $V_{CC}$" (which his typically in the range from 5 to 5.5 volts above ground) from an external device. The External $V_{CC}$ output line of circuit 10' is connected to the source of P3, and thus always remains at voltage External $V_{CC}$. The External $V_{CC}$ output line (but not the $V_{CC}$ output line) is connected to some of the components of the FIG. 5 circuit, including buffer circuit 11, to supply power to these components.

Supply voltage circuit 10' operates as follows in the active mode of FIG. 5 (in response to a "low" level of the inverse of control signal −DPDown received at the gate of PMOS transistor P3. Buffer circuit 11 receives external control signal "External −DPDown" from an external device and buffers it to generate −DPDown. Signal −DPDown is inverted in inverter $I_2$, and the inverse of signal −DPDown (asserted at the output of $I_2$) is asserted to the gate of P3. When −DPDown is high, the voltage at the gate of P3 is low and thus transistor P3 is on, and the second output line ($V_{CC}$) of circuit 10' is pulled up to a voltage approximately equal to External $V_{CC}$. This output voltage $V_{CC}$ (substantially equal to External $V_{CC}$) is supplied to the source of each of various PMOS transistors of the FIG. 5 chip (including the PMOS transistor of a CMOS inverter in each of address buffers A0-Ap, one of which inverters is shown in FIG. 6, and all of which inverters share a common well 30 shown in FIG. 6). The body of each of these PMOS transistors (i.e., well 30 of FIG. 6) is connected to the other output line of circuit 10' and is thus held at the voltage External $V_{CC}$. Circuit 10' thus supplies power to the PMOS transistors, with the source and body of each of the PMOS transistors being connected to a different node of circuit 10'.

Supply voltage circuit 10' operates as follows in response to a transition from the active mode to the "deep power down" mode of the FIG. 5 circuit (triggered by a high-to-low transition of −DPDown received from buffer circuit 11). When the level of −DPDown goes low, transistor P3 switches off, and the drain of transistor P3 (and thus the source of each of the PMOS transistors of the FIG. 5 chip connected thereto) floats. During this initial transient state, leakage current in the PMOS transistors connected to circuit 10' causes the voltage at the drain of P3 to fall (from its initial value, substantially equal to External $V_{CC}$, at the start of the active-to-"deep power down" transition). When the voltage at the drain of P3 falls below External $V_{CC}$ by an amount equal to $V_{th}$, the threshold voltage required for current flow through diode-connected transistor N4 (between its drain and source), transistor N4 prevents such voltage from falling further and holds the drain of P3 at the voltage (External $V_{CC}$−$V_{th}$). In this state, circuit 10' supplies voltage External $V_{CC}$ to the body of each PMOS transistor connected thereto, and it supplies a different voltage (External $V_{CC}$−$V_{th}$) to the source of each such PMOS transistor. In response to these supply voltages from circuit 10', each of the PMOS transistors enters a "deep power down" mode in which it consumes very low power.

The threshold voltage, $V_{th}$, of an MOS device is related to the back bias voltage applied to the device in the following manner:

$$V_{th}=V_{T0}+\gamma((\psi_B+V_{BS}/2)^{1/2}-(\psi_B)^{1/2}),$$

where $V_{BS}$ is the back bias voltage, and $V_{T0}$ is $V_{th}$ in the case that $V_{BS}$=zero. As $V_{BS}$ approaches zero, $V_{T0}$ approaches $V_{th}$. As $V_{BS}$ is increased, $V_{th}$ will also increase.

The current $I_D$ of the MOS transistor in the subthreshold region is proportional to $e^{q(Vg-Vth)/KT}$. As $V_{th}$ increases due to increasing back bias, subthreshold leakage (current $I_D$) is lowered exponentially.

Next, with reference to FIG. 6, we explain in more detail the preferred implementation of circuit 10' (and a CMOS inverter of one of address buffer A0-Ap connected thereto) of FIG. 5, and the advantages of the invention over the prior art.

The invention substantially reduces the problem of subthreshold leakage current (e.g., leakage between the source and drain of transistor P2 of FIG. 6) in the "deep power down" mode, for the following reasons. The CMOS inverter of FIG. 6 comprises transistor P2 (formed in well 30) and transistor N2 (formed in substrate 40) and is powered by the inventive supply voltage circuit 10'. In the active mode (when −DPDown is high and transistor P3 of circuit 10' is on), Node 2 (and thus the source of P2) is at a voltage substantially equal to External $V_{CC}$, Node 1 (and thus well 30) is also held at the voltage External $V_{CC}$. Then, upon a transition to the "deep power down" mode (triggered by a high-to-low transition of −DPDown), transistor P3 switches off and Node 2 is allowed to float. In FIG. 6, the large capacitance on Node 2 is represented by capacitor C1 (shown connected between Node 2 and ground). Any subthreshold leakage current in transistor P2 will cause the voltage at Node 2 initially to fall (this can be thought of as a partial discharging of capacitor C1, across which the potential difference External $^-V_{CC}$ had built up during the active mode). Thus the voltage at the drain of P3 begins to fall, and it continues to fall until it falls below External $V_{CC}$ by an amount equal to $V_{th}$, where $V_{th}$ is the threshold voltage required for current flow between the source and drain of diode-connected transistor N4. At this point, transistor N4 holds the drain of P3 at the voltage V'=(External $V_{CC}$−$V_{th}$).

By employing a diode-connected transistor N4 with an appropriate $V_{th}$ characteristic, the back bias voltage between the body of P2 (held at the voltage External $V_{CC}$ by circuit 10') and the source of P2 (held at the voltage V' by circuit 10') will greatly decrease the total amount of subthreshold leakage current in transistor P2 during the deep power down mode. By employing a greater back bias voltage (i.e., a greater positive value of the amount by which the voltage at P2's source is below the voltage at P2's body), the amount of subthreshold leakage falls off greatly.

For convenience, the described diode-connected transistor N4 is sometimes referred to herein as a "diode" (as are functional counterparts to diode N4 in alternative embodiments of the invention).

However, the time required to pull Node 2 back up to a voltage substantially equal to External $V_{CC}$ at the end of the deep power down mode will increase with increasing back bias voltage.

The optimal $V_{th}$ characteristic of the diode of the invention is preferably experimentally determined (during the design of each implementation of the invention) according to the following criteria: the back bias voltage caused by the diode is selected to be sufficiently large to achieve a desired decrease in leakage current (the magnitude of the back bias voltage will typically be greater in the case of transistors subject to greater leakage current); and the back bias voltage is selected to be sufficiently small to achieve a desired (sufficiently short) "power up" time for powering up each transistor during a transition from the deep power down mode to the active mode (without the above-described undesirable latch-up effect).

The wells of P-channel devices powered in accordance with the invention do not change during a transition from the active to the deep power down mode; and thus the capacitance that needs to be charged up (during a subsequent transition back to the active mode) is much smaller. Also, in embodiments of the invention in which the voltage of the source is not discharged all the way to ground in the deep power down mode, the ΔV that each source node needs to move is much smaller as well. The fact that a chip powered in accordance with the invention is trying to move a much smaller capacitance by a much smaller voltage value enables the chip to perform a deep power down-to-active mode transition in a much shorter power up time (than the power up time required for a conventional chip to perform the same operation). Since the well potential (of a chip powered in accordance with the invention) is not changing either, the sources can be brought up as fast as possible without worrying about latch up.

As noted above, the amount of leakage current in a MOS transistor tends to be especially large if the transistor has very short channel length (e.g., where channel length L in FIG. 6 is very short).

The inventor has found that, in implementations of FIG. 5 (for use in laptop or other personal computers) in which memory array 16 is an array of flash memory cells with four megabit density and in which External $V_{CC}$ is in the range from about 5 to 5.5 volts, the optimal value of $V_{th}$ (of the inventive diode) is in the range from about 1 volt to 2 volts. A back bias voltage in this range can be implemented using a single diode-connected transistor N4 (having $V_{th}$ between 1 volt and 2 volts), or by replacing N4 with two diode-connected transistors connected in series as represented by element 19 of FIG. 5A (for example, with each of the two having a threshold voltage in the range from 0.7 volts to 1 volt).

In variations on the above-described embodiment of the invention, the diode (e.g., diode N4) is omitted. In these embodiments, the supply voltage circuit (in the deep power mode) holds the body of each of one or more PMOS transistors at the supply voltage $V_{CC}$, while allowing the source of each PMOS transistor to float. The supply voltage circuit holds the source at a voltage substantially equal to the supply voltage $V_{CC}$ (in the active mode), so that after an active-to-"deep power down" mode transition, leakage current in each PMOS transistor reduces the voltage at its source. An example of such alternative embodiment of the invention is the integrated circuit shown in FIG. 7. The circuit of FIG. 7 differs from that of FIG. 5 only in that its supply voltage circuit 110 is slightly different from circuit 10' of FIG. 5. Circuit 110 differs from circuit 10' only in that circuit 110 does not include diode-connected transistor N4 of circuit 10'.

Figure 7:
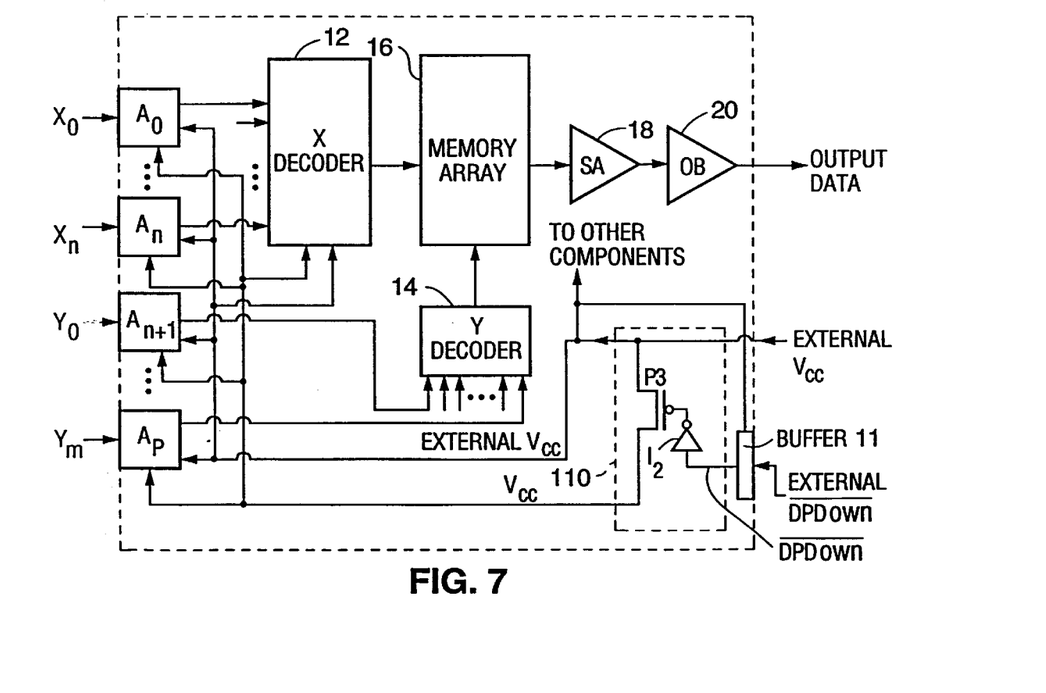
FIG. 7 is a block diagram of an integrated circuit (a memory chip) embodying the present invention, which differs from the FIG. 5 circuit only in that its voltage supply circuit (110) does not implement a back bias voltage (whereas voltage supply circuit 10' of FIG. 5 includes diode N4 for implementing such a back bias voltage).

Thus, the FIG. 7 embodiment allows the source of each PMOS transistor to go as low as the leakage takes it (during the deep power down mode). It generates the same biasing voltage as does the FIG. 6 embodiment and hence reduces the leakage current. The only disadvantage of the FIG. 7 embodiment (relative to the FIG. 6 embodiment) is that in the deep power down mode, the source of each PMOS transistor would leak further than in the FIG. 6 embodiment, and thus the FIG. 7 embodiment requires a longer time to power up than does the FIG. 6 embodiment.

With reference again to the FIG. 5 embodiment of the invention, the FIG. 5 chip typically includes approximately twenty address buffers A0-Ap (each including a CMOS inverter), an implementation of decoder circuit 12 including about 4000 CMOS inverters, and a single circuit 10' which supplies power to approximately 4020 PMOS transistors (one PMOS transistor in each of the approximately 4020 CMOS inverters in decoder circuit 12 and the address buffers).

Many other embodiments are contemplated in which the integrated circuit of the invention includes one or more of the inventive supply voltage circuits (circuit 10', circuit 110, or circuit 210 to be discussed below, or variations on any of them). Each of the inventive supply voltage circuits can be connected to supply power to one or more PMOS transistors of one or more of the component circuits of the integrated circuit. It is contemplated that typical memory chips embodying the invention will include no more than a few (e.g., three or four) such supply voltage circuits, but that these supply circuits will supply power to a much greater number of MOS transistors.

In another class of embodiments, the supply voltage circuit of the invention is designed to supply power to one or more NMOS (rather than PMOS) transistors of an integrated circuit. In view of the present specification, those of ordinary skill in the art will he able readily to design such alternative embodiments of the invention. Each such embodiment decouples the source from the substrate (body) of an NMOS transistor during the deep power down mode, in the sense that in the deep power down mode the source initially floats (from an initial fixed potential) while the substrate is held at a potential substantially equal to the fixed potential. Preferably, the source is then held at a different fixed potential after floating by a back bias voltage from the initial fixed potential (where the back bias voltage is chosen to achieve a desired decrease in leakage current in the NMOS transistor with a desired "power up" time for undergoing a deep power down-to-active mode transition.

One example of this class of embodiments of the invention is next described with reference to FIG. 8. In FIG. 8, voltage supply circuit 210 supplies power to NMOS transistor N5 formed in substrate 50 of P-type semiconductive material. It is contemplated that the FIG. 8 circuitry is a portion of a single integrated circuit similar to that of FIG. 5 (but with circuit 210 replacing circuit 10' of FIG. 5, or with both circuit 210 and circuit 10' included for supplying power to different MOS transistors of such integrated circuit). Transistor N5 can be any of the NMOS transistors of such integrated circuit. In FIG. 8, the capacitance on the source of transistor N5 is represented by capacitor C1 (shown connected between the source of N5 and ground). In FIG. 8, control signal –DPDown is asserted (from a buffer circuit such as circuit 11 of FIG. 5) to the gate of transistor N3'.

During the active mode (when control signal –DPDown is high), voltage supply circuit 210 operates as follows. Transistor N3' is on, and thus the source of transistor N5 is held at a potential substantially equal to ground potential. The substrate of N5 (Node 1 of the FIG. 8 circuit) is connected directly to ground. The drain of N5 is held at a voltage substantially above ground so that transistor N5 is in its active mode. The drain of N3' and the source of N5 are at "Node 2" of the FIG. 8 circuit.

Diode-connected transistor N4' has its source grounded and its common drain and gate connected to Node 2.

The term "reference voltage" will sometimes be employed to denote the voltage at which the supply voltage circuit of the invention holds the body of each MOS transistor to which it supplies power. With this terminology, voltage External $V_{CC}$ (at which the body of P2 is held in FIG. 6) is the reference voltage of the FIG. 6 embodiment, and the ground potential at which the body of N5 is held in FIG. 8 is the reference voltage of the FIG. 8 embodiment.

With reference again to FIG. 8, upon a transition from the active mode to the deep power down mode (triggered by a high-to-low transition of control signal –DPDown received at the gate of transistor N3'), transistor N3' turns off, allowing the source of N5 initially to float. The substrate (body) of N5 is still held at ground. As a result of any subthreshold leakage current between the source and drain of N5, the voltage at Node 2 (the voltage at the source of N5) will increase. The voltage at Node 2 will continue to rise until it reaches the voltage $V_{th}$ above ground potential, where $V_{th}$ is the threshold voltage required for current flow through diode-connected transistor N4' (from its drain to its source). Diode-connected transistor N4' prevents the Node 2 voltage from rising further and holds Node 2 (i.e., the source of N5) at the voltage $V_{th}$ above ground. In this state, circuit 210 holds the substrate of N5 (and the substrate of any other NMOS transistor to which it is connected) at ground potential, and holds the source of each such NMOS transistor at a different voltage ($V_{th}$ above ground). The back bias voltage ($V_{th}$) between the source and substrate of each NMOS transistor (after current has begun to flow through diode-connected transistor N4') is chosen to be adequate to cause the leakage current between each NMOS transistor's source and drain to decrease greatly (thereby reducing power consumption in the deep power mode).

As in the other embodiments of the invention, the voltage drop ($V_{th}$) of the FIG. 8 embodiment preferably is chosen to achieve both a desired decrease in leakage current in N5 (and any other NMOS transistor powered by circuit 210) during the deep power down mode and a desired time for "powering up" each such NMOS transistor during a "deep power down"-to-active mode transition.

The back bias voltage of any embodiment of the invention is preferably implemented with one diode-connected MOS transistor (e.g., N4 of FIG. 5 or N4' of FIG. 8) or two diode-connected MOS transistors connected in series (each responsible for half of the desired total back bias voltage). Alternatively the back bias voltage can be implemented by other means, such as an MOS transistor configured as a source follower with a voltage on its gate which determines the magnitude of the back bias voltage.

Preferred embodiments of the invention have been described with reference to FIGS. 5–8. Although preferred embodiments have been described in some detail, it is contemplated that changes from each of these embodiments can be made without departing from the spirit and scope of the invention as defined by the appended claims.

What is claimed is:

1. An integrated circuit, comprising:
    at least one transistor of first polarity, wherein the at least one transistor of first polarity comprises a body and a source;
    a supply voltage circuit, wherein the supply voltage circuit implements a first, second and third potential, wherein the third potential differs from the first potential by some nonzero voltage difference, further wherein the supply voltage circuit has a first operating mode and a second operating mode; and
    wherein the first potential is provided to the body of the at least one transistor of first polarity in the first and second operating modes, further wherein the second potential is provided to the source of the at least one transistor of first polarity in the second operating mode, still further wherein the source of the at least one transistor of first polarity is allowed to float to the third potential during an initial transient state following transition to the first operating mode, still farther wherein the source of the at least one transistor of first polarity is held at the third potential in the first operating mode after the initial transient state.

2. The integrated circuit of claim 1 wherein the supply voltage circuit comprises:
    a first transistor having a gate, source and drain, wherein an external reference voltage is applied to the source of the first transistor, further wherein a control signal is applied to the gate of the first transistor, still further wherein the control signal has a first state corresponding to the first operating mode and a second state corresponding to the second operating mode;
    a first output line connected to the source of the first transistor;
    a second output line connected to the drain of the first transistor;
    a diode-connected transistor connected between the first and second output lines;
    wherein when the control signal is in the first state, the first transistor is off, and the first potential is applied to the first output line, the second output line floats to the third potential during the initial transient state and the second output line is held at the third potential after the initial transient state; and
    wherein when the control signal is in the second state, the first transistor is on, and the first potential is applied to the first output line and the second potential is applied to the second output line.

3. The integrated circuit of claim 2, wherein the first transistor is of the first polarity and the at least one diode-connected transistor is of a polarity selected from the group consisting of the first polarity and a second polarity.

4. The integrated circuit of claim 3, wherein the second polarity is opposite the first polarity.

5. The integrated circuit of claim 4, wherein the first polarity is P-channel and the second polarity is N-channel.

6. The integrated circuit of claim 1, wherein the supply voltage circuit comprises:
    a first transistor having a gate, source and drain, wherein an external reference voltage is applied to the source of the first transistor, further wherein a control signal is applied to the gate of the first transistor, still further wherein the control signal has a first state corresponding to the first operating mode and a second state corresponding to the second operating mode;
    a first output line connected to the source of the first transistor;
    a second output line connected to the drain of the first transistor;
    at least two diode-connected transistors connected in series, wherein the series-connected at least two diode-connected transistors are connected between the first and second output lines;
    wherein when the control signal is in the first state, the first transistor is off, and the first potential is applied to the first output line, the second output line floats to the third potential during the initial transient state and the second output line is held at the third potential after the initial transient state; and
    wherein when the control signal is in the second state, the first transistor is on, and the first potential is applied to the first output line and the second potential is applied to the second output line.

7. The integrated circuit of claim 6, wherein the first transistor is of the first polarity and the series-connected at least two diode-connected transistors are of a polarity selected from the group consisting of the first polarity and a second polarity.

8. The integrated circuit of claim 1 wherein the supply voltage circuit comprises:
    a first transistor having a gate, source and drain, wherein an external reference voltage is applied to the source of the first transistor, further wherein a control signal is applied to the gate of the first transistor, still further wherein the control signal has a first state corresponding to the first operating mode and a second state corresponding to the second operating mode;

a first output line connected to the source of the first transistor;

a second output line connected to the drain of the first transistor;

wherein when the control signal is in the first state, the first transistor is off, the first potential is applied to the first output line, and the second output line floats to the third potential during the initial transient state; and wherein when the control signal is in the second state, the first transistor is on, and the first potential is applied to the first output line and the second potential is applied to the second output line.

9. The integrated circuit of claim 1 wherein the supply voltage circuit comprises:

a first transistor having a gate, source and drain, wherein an external reference voltage applied to the source of the first transistor, further wherein a control signal is applied to the gate of the first transistor, still further wherein the control signal has a first state corresponding to the first operating mode and a second state corresponding to the second operating mode;

a first output line connected to the source of the first transistor;

a second output line connected to the drain of the first transistor;

a second transistor configured as a source follower, wherein the second transistor has a gate, further wherein a voltage is applied to the gate of the second transistor to control the third potential, still further wherein the second transistor is connected between the first and second output lines;

wherein when the control signal is in the first state, the first transistor is off, and the first potential is applied to the first output line, the second output line floats to the third potential during the initial transient state, and the third potential is applied to the second output line after the initial transient state; and wherein when the control signal is in the second state, the first transistor is on, and the first potential is applied to the first output line and the second potential is applied to the second output line.

10. The integrated circuit of claim 1, wherein the second potential substantially equals the first potential.

11. The integrated circuit of claim 1, wherein the first potential is substantially 5 to 5.5 volts, the second potential is substantially 5 to 5.5 volts and the third potential is less than the first potential by the nonzero voltage difference.

12. The integrated circuit of claim 1, wherein the first potential is substantially 5 to 5.5 volts, the second potential is substantially 5 to 5.5 volts and the third potential is substantially 1 to 2 volts less than the first potential.

13. The integrated circuit of claim 1, wherein the first potential is substantially ground potential, the second potential is substantially ground potential and the third potential is greater than the first potential by the nonzero voltage difference.

14. The integrated circuit of claim 1, wherein the first potential is substantially ground potential, the second potential is substantially ground potential and the third potential is substantially 1 to 2 volts greater than the first potential.

15. A memory circuit, comprising:

at least one component transistor of first polarity, wherein the at least one component transistor of first polarity comprises a body and a source;

a supply voltage circuit, wherein the supply voltage circuit implements a first, second and third potential, wherein the second potential substantially equals the first potential, further wherein the third potential differs from the first potential by some nonzero voltage difference, still further wherein the supply voltage circuit has a first operating mode and a second operating mode; and wherein the first potential is provided to the body of the at least one component transistor of first polarity in the first and second operating modes, further wherein the second potential is provided to the source of the at least one component transistor of first polarity in the second operating mode, still further wherein the source of the at least one component transistor of first polarity is allowed to float to the third potential during an initial transient state following transition to the first operating mode, still further wherein the source of the at least one component transistor of first polarity is held at the third potential in the first operating mode after the initial transient state.

16. The memory circuit of claim 15 wherein the first potential is substantially 5 to 5.5 volts, the second potential is substantially 5 to 5.5 volts and the third potential is substantially 1.4 to 2 volts less than the first potential.

17. The memory circuit of claim 15 wherein the at least one component transistor of first polarity is a P-channel MOS transistor.

18. A method of operating a transistor having a body and a source, comprising:

applying a first potential to the body of the transistor in a first or second operating mode;

applying a second potential to the source of the transistor in the second operating mode;

allowing the source of the transistor to float to a third potential during an initial transient state after a transition from the second operating mode to the first operating mode; and holding the source of the transistor at the third potential in the first operating mode after the initial transient state.

19. The method of claim 18, wherein applying a second potential comprises a second potential substantially equal to the first potential.

20. The method of claim 18, wherein allowing the source of the transistor to float to a third potential comprises a third potential differing from the first potential by a nonzero voltage difference.

21. The method of claim 18, wherein allowing the source of the transistor to float to a third potential comprises a third potential differing from the first potential by substantially 1 to 2 volts.

22. The method of claim 18, wherein applying a first potential, applying a second potential and allowing the source of the transistor to float to a third potential comprise a first potential of substantially 5 to 5.5 volts, a second potential of substantially 5 to 5.5 volts and a third potential less than the first potential by substantially 1 to 2 volts.

23. The method of claim 18, wherein applying a first potential, applying a second potential and allowing the source of the transistor to float to a third potential comprise a first potential of substantially ground potential, a second potential of substantially ground potential and a third potential greater than the first potential by substantially 1 to 2 volts.

24. The method of claim 18, wherein applying a first potential to the body of the transistor comprises a body selected from the group consisting of a well in which the source of the transistor is formed and a substrate in which the source of the transistor is formed.

25. A method of operating an address buffer of a memory circuit, comprising:

applying a first potential to a body of a transistor of the address buffer in a first or second operating mode;

applying a second potential to a source of the transistor in the second operating mode;

allowing the source of the transistor to float to a third potential during an initial transient state following a transition from the second operating mode to the first operating mode; and holding the source of the transistor at the third potential in the first operating mode after the initial transient state.

26. The method of claim 25, wherein applying a second potential comprises a second potential substantially equal to the first potential.

27. The method of claim 25, wherein allowing the source of the transistor to float to a third potential comprises a third potential differing from the first potential by substantially 1 to 2 volts.

28. The method of claim 25, wherein applying a first potential, applying a second potential and allowing the source of the transistor to float to a third potential comprise a first potential of substantially 5 to 5.5 volts, a second potential of substantially 5 to 5.5 volts and a third potential less than the first potential by substantially 1 to 2 volts.

29. The method of claim 25, wherein applying a first potential, applying a second potential and allowing the source of the transistor to float to a third potential comprise a first potential of substantially ground potential, a second potential of substantially ground potential and a third potential greater than the first potential by substantially 1 to 2 volts.

30. A method of operating a transistor having a source and a body, comprising:

maintaining the body of the transistor at an external reference potential during a first and second operating modes, wherein the body is a body selected from the group consisting of a well in which the source is formed and a substrate in which the source is formed;

maintaining the source of the transistor at a potential substantially equal to the external reference potential during the first operating mode;

decoupling the source from the body in the second operating mode;

allowing the source to float to a second potential during an initial transient state following transition to the second operating mode; and holding the source at the second potential during the second operating mode after the initial transient state.

31. A memory circuit having first and second operating modes, comprising:

a plurality of address decoder circuits, wherein at least one address decoder circuit comprises at least one inverter, further wherein each at least one inverter comprises a transistor of first polarity having a source, still further wherein each source is formed in a common body, still further wherein the common body is a body selected from the group consisting of a well in which each source is formed and a substrate in which each source is formed;

wherein an external reference voltage is applied to the common body in the first and second operating modes;

wherein a potential substantially equal to the external reference voltage is applied to the source of each transistor of first polarity in the first operating mode;

wherein the source of each transistor of first polarity is allowed to float to a second potential during an initial transient state following transition to the second operating mode; and wherein the source of each transistor of first polarity is held at the second potential during the second operating mode after the initial transient state.

32. A memory circuit having first and second operating modes, comprising:

a plurality of address buffers, wherein each address buffer comprises an inverter, further wherein each inverter comprises a transistor of first polarity having a source, still further wherein each source is formed in a common body, still further wherein the common body is a body selected from the group consisting of a well in which each source is formed and a substrate in which each source is formed;

wherein an external reference voltage is applied to the common body in the first and second operating modes;

wherein a potential substantially equal to the external reference voltage is applied to the source of each transistor of first polarity in the first operating mode;

wherein the source of each transistor of first polarity is allowed to float to a second potential during an initial transient state following transition to the second operating mode; and wherein the source of each transistor of first polarity is held at the second potential during the second operating mode after the initial transient state.

33. A method of reducing subthreshold leakage current in a transistor having a source and a body, comprising:

maintaining the body and the source of the transistor at substantially a first potential during a first operating mode, wherein the body is a body selected from the group consisting of a well in which the source is formed and a substrate in which the source is formed;

decoupling the source from the body in a second operating mode;

holding the body at the first potential during the second operating mode;

allowing the source to float to a second potential during an initial transient state following transition to the second operating mode; and holding the source at the second potential during the second operating mode after the initial transient state.

34. A method of reducing subthreshold leakage current in an integrated circuit having a plurality of transistors of first polarity sharing a common body, each transistor of first polarity having a source, the method comprising:

maintaining the common body and the source of each transistor of first polarity at substantially a first potential during a first operating mode, wherein the common body is a body selected from the group consisting of a well in which each source is formed and a substrate in which each source is formed;

decoupling each source from the common body in a second operating mode;

holding the common body at the first potential during the second operating mode;

allowing each source to float to a second potential during an initial transient state following transition to the second operating mode; and holding each source at the second potential during the second operating mode after the initial transient state.

35. An integrated circuit, comprising:

a plurality of transistors of first polarity having a source, wherein each transistor of first polarity shares a common body, further wherein the common body is a body selected from the group consisting of a well in which the source of each transistor of first polarity is formed and a substrate in which the source of each transistor of first polarity is formed; and a supply voltage circuit, wherein the supply voltage circuit applies substantially a first potential to the common body and the source of each transistor of first polarity during a first operating mode, the supply voltage circuit applies the first potential to the common body during a second operating mode, the supply voltage circuit allows the source of each transistor of first polarity to float to a second potential during an initial transient state following transition to the second operating mode, and the supply voltage circuit applies the second potential to the source of each transistor of first polarity in the second operating mode after the initial transient state.

36. A memory circuit, comprising:

a plurality of address buffers;

a row address decoder circuit;

a column address decoder circuit;

a plurality of transistors of first polarity sharing a common body, wherein the transistors of first polarity are included in at least one component selected from the group consisting of the plurality of address buffers, the row address decoder circuit and the column address decoder circuit, further wherein the common body is a body selected from the group consisting of a well in which the source of each transistor of first polarity is formed and a substrate in which the source of each transistor of first polarity is formed; and a supply voltage circuit, wherein the supply voltage circuit applies substantially a first potential to the common body and the source of each transistor of first polarity during a first operating mode, the supply voltage circuit applies the first potential to the common body during a second operating mode, the supply voltage circuit allows the source of each transistor of first polarity to float to a second potential during an initial transient state following transition to the second operating mode, and the supply voltage circuit applies the second potential to the source of each transistor of first polarity in the second operating mode after the initial transient state.

37. A memory circuit, comprising:

a plurality of address buffers;

a row address decoder circuit;

a column address decoder circuit;

a plurality of P-channel MOS transistors sharing a common well in which a source of each P-channel MOS transistor is formed, wherein the P-channel MOS transistors are included in the plurality of address buffers, the row address decoder circuit and the column address decoder circuit; and a supply voltage circuit, wherein the supply voltage circuit applies substantially 5 to 5.5 volts to the common well and the source of each P-channel MOS transistor during an active mode, the supply voltage circuit applies substantially 5 to 5.5 volts to the common well during a deep power down mode, the supply voltage circuit allows the source of each P-channel MOS transistor to float to substantially 3 to 4.1 volts during an initial transient state following transition to the deep power down mode, and the supply voltage circuit applies substantially 3 to 4.1 volts to the source of each P-channel MOS transistor in the deep power down mode after the initial transient state.

* * * * *